(12) United States Patent
Huang et al.

(10) Patent No.: US 9,761,799 B2
(45) Date of Patent: Sep. 12, 2017

(54) BOTTOM ELECTRODE STRUCTURE FOR IMPROVED ELECTRIC FIELD UNIFORMITY

(71) Applicant: Taiwan Semiconductor Manufacturing Co., Ltd., Hsin-Chu (TW)

(72) Inventors: Jian-Shiou Huang, Fangliao Township (TW); Cheng-Yuan Tsai, Chu-Pei (TW); Yao-Wen Chang, Taipei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 15/270,251

(22) Filed: Sep. 20, 2016

(65) Prior Publication Data

US 2017/0012198 A1 Jan. 12, 2017

Related U.S. Application Data

(62) Division of application No. 14/645,932, filed on Mar. 12, 2015, now Pat. No. 9,502,649.

(51) Int. Cl.
*H01L 45/00* (2006.01)

(52) U.S. Cl.
CPC .............. *H01L 45/16* (2013.01); *H01L 45/08* (2013.01); *H01L 45/1233* (2013.01); *H01L 45/1253* (2013.01); *H01L 45/146* (2013.01); *H01L 45/1675* (2013.01)

(58) Field of Classification Search
CPC ............. H01L 45/1233; H01L 45/1253; H01L 45/1273
See application file for complete search history.

(56) References Cited

U.S. PATENT DOCUMENTS

| 7,729,162 B2 * | 6/2010 | Dennison ........... G11C 13/0004 |
| | | 365/148 |
| 2010/0065836 A1 | 3/2010 | Lee |
| 2011/0057161 A1 | 3/2011 | Sandhu et al. |

* cited by examiner

*Primary Examiner* — Mark Prenty
(74) *Attorney, Agent, or Firm* — Eschweiler & Potashnik, LLC

(57) ABSTRACT

A method for manufacturing an integrated circuit (IC) is provided. An etch is performed into an upper surface of an insulating layer to form an opening. A plurality of electrode layers is formed filling the opening. Forming the plurality of electrode layers comprises repeatedly forming an electrode layer conformally lining an unfilled region of the opening until the opening is filled. Forming the electrode layer comprises depositing the electrode layer and treating a surface of the electrode layer that faces an interior of the opening. A planarization is performed into the plurality of electrode layers to the upper surface of the insulating layer.

20 Claims, 11 Drawing Sheets

BOTTOM ELECTRODE STRUCTURE FOR IMPROVED ELECTRIC FIELD UNIFORMITY

REFERENCE TO RELATED APPLICATION

This application is a Divisional of U.S. application Ser. No. 14/645,932, filed on Mar. 12, 2015, the contents of which are hereby incorporated by reference in their entirety.

BACKGROUND

Many modern day electronic devices contain electronic memory. Electronic memory may be volatile memory or non-volatile memory. Non-volatile memory is able to store data in the absence of power, whereas volatile memory is not. Resistive random access memory (RRAM) is one promising candidate for next generation non-volatile memory due to its simple structure and its compatibility with complementary metal-oxide-semiconductor (CMOS) logic fabrication processes.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
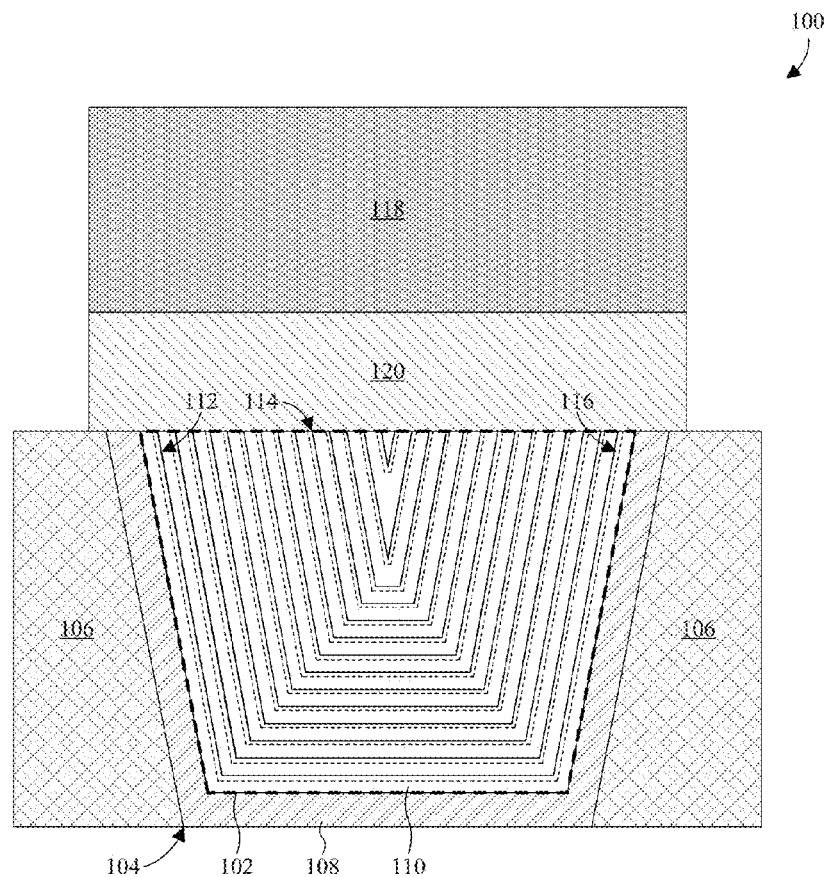
FIG. 1 illustrates a cross-sectional view of some embodiments of an integrated circuit with a multilayer bottom electrode.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A resistive random access memory (RRAM) cell includes a data storage region (e.g., including a region of a high κ layer) and an ion reservoir region (e.g., including a region of the high κ layer and a capping layer) stacked between top and bottom electrodes. The data storage region includes a variable resistance that represents a unit of data, such as a bit of data, and the ion reservoir region stores oxygen ions corresponding to oxygen vacancies. Through application of an electric field between the top and bottom electrodes, oxygen ions can be moved between the ion reservoir and the data storage region. When oxygen ions are moved to the data storage region from the ion reservoir region, the oxygen ions fill oxygen vacancies and increase the variable resistance. When oxygen ions move to the ion reservoir region from the data storage region, the oxygen ions leave oxygen vacancies and decrease the variable resistance. Further, through application of an electric field between the top and bottom electrodes, the variable resistance can be measured.

A challenge with RRAM cells is the uniformity of the electric fields between top and bottom electrodes. Non-uniform electric fields negatively impact the electrical performance of RRAM cells, especially while measuring the variable resistance. Voltages, current, and read signals may vary from expected values, thereby reducing the size of the switching window and increasing the likelihood of data loss. Another challenge with RRAM cells is that the high κ layers are conventionally exposed to air during manufacturing. This introduces oxygen into the high κ layers, which negatively impacts the electrical operation of the RRAM cells. As noted above, the variable resistances of RRAM cells are varied through manipulation of oxygen ions.

In view of the foregoing, the present application is directed to an integrated circuit, and a corresponding method for manufacturing the integrated circuit, to address at least the foregoing challenges. In some embodiments, the integrated circuit includes a multilayer bottom electrode, a dielectric layer arranged over the multilayer bottom electrode, and a top electrode arranged over the top dielectric layer. The top and bottom electrodes may correspond to the top and bottom electrodes of an RRAM cell, and the dielectric layer may correspond to the high κ layer of an RRAM cell. In some of such embodiments, the top electrode is sized to fully cover the dielectric layer. This advantageously reduces exposure of the dielectric layer to air during manufacture.

The multilayer bottom electrode is arranged within an opening of an insulating layer, and includes a plurality of layers stacked upon each other and lining the opening. The layers of the plurality include corresponding surfaces facing an interior of the opening, and extending respectively at angles relative to a top surface of the multilayer bottom electrode. Further, the layers of the plurality include corresponding regions of increased resistance or height extending along the corresponding surfaces. This arrangement of stacked layers advantageously leads to oscillations in the resistance or height of the top surface of the bottom electrode, which lead to a more uniform electric field between top and bottom electrodes. Since charge flows along the path of least resistance, charge flowing between the top and bottom electrodes flows through less resistive regions of the bottom electrode top surface. More resistive regions serve as dams to deflect charge to neighboring, less resistive regions. Further, electric fields concentrate in regions with the highest radius of curvature. The oscillations in height lead to a fairly uniform distribution of regions with high radiuses of curvature.

With reference to FIG. 1, a cross-sectional view 100 of some embodiments of a semiconductor structure with a multilayer bottom electrode 102 (highlighted by a thick, dashed line) is provided. The semiconductor structure is typically employed within an RRAM cell. However, the semiconductor structure may be employed within other devices. For example, the semiconductor structure may be employed within a metal-insulator-metal (MIM) capacitor or any other capacitor. The bottom electrode 102 fills an opening 104 in an insulating layer 106. The insulating layer 106 includes one or more dielectric materials, such as, for example, silicon carbide (SiC), silicon nitride (SiN), silicon dioxide ($SiO_2$), nitrogen-free anti-reflective coating (NFARC), and undoped silicate glass (USG). Further, in some embodiments, the bottom electrode 102 fills the opening 104 over a diffusion barrier layer 108 lining the opening 104. The diffusion barrier layer 108 prevents material underlying the bottom electrode 102 from diffusing into the bottom electrode 102. The diffusion barrier layer 108 may be, for example, a conductive material, such as tantalum nitride (TaN) and titanium nitride (TiN).

The bottom electrode 102 extends into the insulating layer 106 from about even with a top surface of the insulating layer 106, and includes a plurality of layers 110 stacked (e.g., laterally stacked or vertically stacked) upon each other and lining the opening 104. In some embodiments, where the diffusion barrier layer 108 lines the opening 104, the plurality of stacked layers 110 line the opening 104 over the diffusion barrier layer 108. The plurality of stacked layers 110 are a conductive material, such as, for example, TiN or a material including TiN, and typically have u- or v-shaped profiles. Further, the plurality of stacked layers 110 may include, for example, between about 30 and about 50 layers, and/or may include, for example, a common thickness, such as about 800 Angstroms.

Each stacked layer 110 includes a first surface 112 facing an interior of the opening 104, and extending at an angle relative to a top surface 114 of the bottom electrode 102 (i.e., a top interface of the opening 104). Further, each stacked layer 110 includes a region 116 (demarcated by a thin, dashed line) with a resistance and/or hardness different than the rest of the stacked layer 110 and extending along the first surface 112. Accordingly, each stacked layer 110 includes a resistance and/or hardness that varies along its thickness. As discussed in greater detail hereafter, the varying resistance and/or hardness of a stacked layer 110 is due to a surface treatment of the first surface 112 during the manufacture of the stacked layer 110. The surface treatment may, for example, expose the first surface 112 to a forming gas of hydrogen and nitrogen to increase the concentration of hydrogen or nitrogen in the region 116. In some embodiments, where a stacked layer 110 includes a hardness that varies along its thickness, the height of the stacked layer 110 also varies along its thickness. As discussed in greater detail hereafter, the harder regions of the stacked layer 110 are more difficult remove during a planarization of the stacked layer 110, whereby the softer regions tend to be removed faster.

The plurality of stacked layers 110 collectively define the top surface 114 of the bottom electrode 102 by second surfaces respectively at angles relative to the first surfaces 112. Because the plurality of stacked layers 110 has resistances and/or hardnesses varying with thicknesses, the bottom electrode top surface 114 has an oscillating resistance and/or hardness along the bottom electrode top surface 114. Further, in some embodiments, the bottom electrode top surface 114 has an oscillating height along the bottom electrode top surface 114. To the extent that the thicknesses of the plurality of stacked layers 110 and the surface treatments are uniform, the spacing between peaks and valleys of the oscillations are fairly uniform. This advantageously allows the bottom electrode 102 to produce a fairly uniform electric field with an overlying top electrode 118. Charge flows along paths of least resistance, which may be fairly uniformly distributed across the bottom electrode top surface 114. Further, charge concentrates on the bottom electrode top surface 114 along regions with the greatest radius of curvature, which may also be fairly uniformly distributed across the bottom electrode top surface 114.

Beyond using the bottom electrode 102 to improve electric field uniformity, the bottom electrode 102 may be employed to form a non-uniform electric field between the bottom electrode 102 and the top electrode 118. By controlling the thicknesses and the surface treatments of the plurality of stacked layers 110, as well as the number of layers in the plurality of stacked layers 110, variations in resistance, hardness, and height can be non-uniformly varied along the top surface of the bottom electrode 102. For example, the electric field can be concentrated around the periphery of the bottom electrode 102.

The top electrode 118 is arranged over the bottom electrode 102, and spaced from the bottom electrode 102 by a dielectric layer 120. The top electrode 118 typically shares a footprint with the dielectric layer 120, which advantageously protects the dielectric layer 120 from air when it corresponds to a high κ layer of an RRAM cell. In alternative embodiments, the top electrode 118 may have a reduced footprint relative to the dielectric layer 120 to improve electric field uniformity. For example, the top electrode 118 may have a circular footprint relative to a square or rectangular footprint of the dielectric layer 120. The top electrode 118 may be, for example, a conductive material, such as doped polysilicon, titanium nitride, tantalum nitride, platinum, iridium, or tungsten.

The dielectric layer 120 insulates the top electrode 118 from the bottom electrode 102 and may be or otherwise include, for example, a high-κ dielectric, such as hafnium oxide (HfO). In some embodiments, nanoparticles are embedded in the dielectric layer 120 to improve electric field uniformity. Smaller nanoparticles embedded in the dielectric layer 120 are known to achieve a more uniform electric field, and therefore known to achieve better scalability for bottom-up semiconductor devices.

Figure 2:
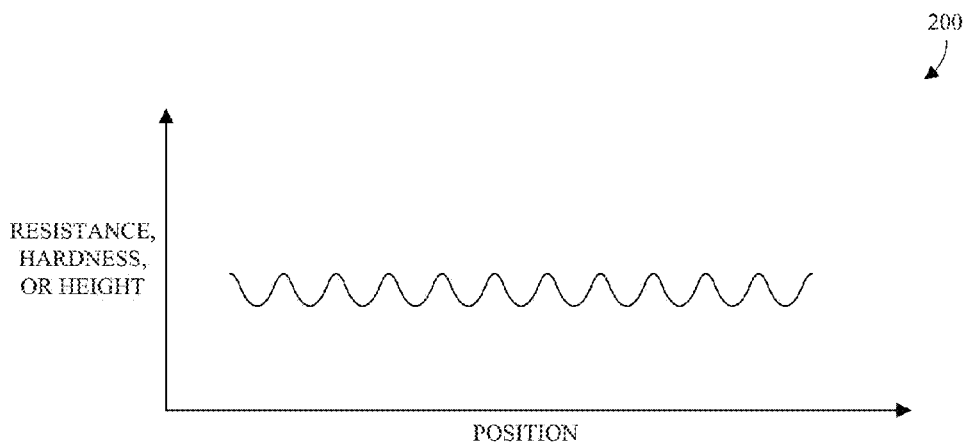
FIG. 2 illustrates a graph of some embodiments of a surface property of a multilayer bottom electrode along a top surface of the multilayer bottom electrode.

With reference to FIG. 2, a graph 200 is provided for some embodiments of a surface parameter of a multilayer bottom electrode along a top surface of the multilayer bottom electrode. The surface property may be, for example, resistance, hardness, or height. The dependent axis of the graph corresponds to the surface property along a line bisecting the top surface, and the independent axis corresponds to position along the line. The line extends from one end of the bottom electrode to an opposing end of the bottom electrode, and passes through a central, vertical axis of bottom electrode.

As illustrated by the graph 200, the surface property of the multilayer bottom electrode, such as resistance or height, oscillates along the top surface of the multilayer bottom electrode. The oscillations are caused by surface treatments of the individual layers, and the arrangement of the individual layers, of the multilayer bottom electrode. The surface treatments of the individual layers treat surfaces of the individual layers facing the interior of the opening. This, in turn, changes properties, such as resistance and hardness, of regions of the individual layers that extent along the treated surfaces. The arrangement of the individual layers arranges the treated surfaces of the individual layers approximately parallel to each other, and respectively at angles relative to the top surface of the bottom electrode. The oscillations may be one or more of uniform, non-uniform, symmetric, and asymmetric. Further, the density of and the distance between the oscillations may be controlled with the thicknesses of the individual layers and the surface treatment time.

Figure 3:
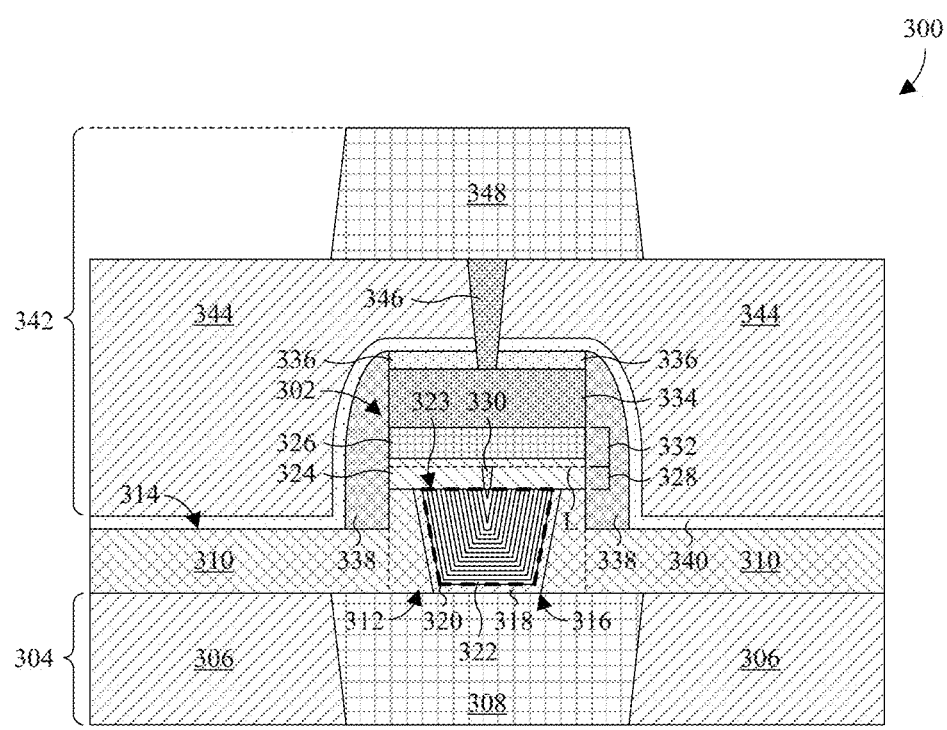
FIG. 3 illustrates a cross-sectional view of some embodiments of an integrated circuit with a resistive random access memory (RRAM) cell, the RRAM cell having a multilayer bottom electrode.

With reference to FIG. 3, a cross-sectional view 300 is provided for some embodiments of an integrated circuit with a RRAM cell 302. The RRAM cell 302 is arranged over a semiconductor substrate (not shown) with a bottom interconnect structure 304 (partially shown) of a back-end-of-line (BEOL) metallization stack arranged between the RRAM cell 302 and the semiconductor substrate. The bottom interconnect structure 304 includes one or more bottom metallization layers stacked within an interlayer dielectric (ILD) layer 306. The ILD layer 306 may be, for example, an oxide or an extreme low-κ dielectric (i.e., a dielectric with a dielectric constant κ less than 2). The bottom metallization layers are defined by bottom metal features 308, such as metal lines, and may be, for example, a metal, such as copper or tungsten.

A bottom insulating layer 310 is arranged over the bottom interconnect structure 304. The bottom insulating layer 310 includes a core region 312 and a ledge 314 extending around the core region 312. The core region 312 is arranged over a metal feature 308 of the bottom interconnect structure 304, and the ledge 314 exhibits a reduced height relative to a top surface of the core region 312. The bottom insulating layer 310 may be, for example, a single layer or a multilayer stack comprising one or more dielectric materials, such as SiC, SiN, SiO$_2$, NFARC, and USG. In some embodiments, the bottom insulating layer 310 includes a SiC layer and an overlying USG layer.

An opening 316 is arranged within the core region 312 of the bottom insulating layer 310, and extends from about even with the top surface of the core region 312 to the bottom metal feature 308. The opening 316 is lined by a diffusion barrier layer 318 and at least substantially filled over the diffusion barrier layer 318 by a bottom electrode 320 (highlighted by a thick, dashed line). The diffusion barrier layer 318 prevents material from diffusing between the bottom interconnect structure 304 and the bottom electrode 320. The diffusion barrier layer 318 may be, for example, a conductive material, such as TaN or TiN. The bottom electrode 320 is typically as described by FIG. 1, and generates an electric field for program, erase, and read operations of the RRAM cell 302. The bottom electrode 320 includes a plurality of layers 322 stacked (e.g., laterally or vertically) upon each other and lining the diffusion barrier layer 318 to improve the uniformity of the electric field. The stacked layers 322 of the plurality have surfaces treated to vary resistance and/or hardness, and may be, for example, a conductive material, such as TiN. The surfaces are typically at angles, respectively, relative to a top surface 323 of the bottom electrode 320, and typically face an interior of the opening 316. Further, in some embodiments, the stacked layers 322 of the plurality have u- or v-shaped profiles or cross-sections.

A high κ layer 324 (i.e., a layer with a dielectric constant κ greater than 3.9) is arranged over the core region 312. The high κ layer 324 may be, for example, a single layer or a multilayer stack comprising HfO and/or a group-V oxide. HfO may be limited to hafnium and oxide (e.g., HfO$_2$), or may include hafnium, oxide, and one or more additional elements (e.g., hafnium silicon oxide (HfSiO), hafnium titanium oxide (HfTiO), hafnium tantalum oxide (HfTaO), or HfAlO). A group-V oxide may be limited to a group-V element and oxide (e.g., niobium oxide (NbO), vanadium oxide (VO), or TaO), or may include a group-V element, oxide, and one or more additional elements (e.g., tantalum titanium oxide (TaTiO) or tantalum aluminum oxide (TaAlO)).

A capping layer 326 is arranged over and abuts the high κ layer 324. The capping layer 326 has the same footprint as the high κ layer 324, and a lower concentration of oxygen than the high κ layer 324. Due to the lower concentration of oxygen in the capping layer 326, the capping layer 326 reacts with the high κ layer 324 to extract oxygen from the high κ layer 324. The depth to which oxygen is extracted from the high κ layer 324 bisects the high κ layer 324 into upper and lower regions (demarcated by a thin, dashed line L), and varies depending upon the thickness and material of the capping layer 326. The capping layer 326 may be, for example, a metal or a metal oxide, such as titanium, hafnium, tantalum, or aluminum.

The lower region of the high κ layer 324 defines a data storage region 328 of the RRAM cell 302. The data storage region 328 has a variable resistance representing a unit of data, such as a bit of data. The variable resistance varies between comparatively low and high resistance states depending upon whether one or more conductive filaments 330 of the data storage region 328 are fully or partially formed. For example, the variable resistance is in a low resistance state when the conductive filaments 330 are fully formed, and the variable resistance is in a comparatively high resistance state when the conductive filaments 330 are partially formed. The conductive filaments 330 extend between top and bottom surfaces of the data storage region 328, and correspond to oxygen vacancies aligned between the top and bottom surfaces of the data storage region 328.

The capping layer 326 and the upper region of the high κ layer 324 collectively define an ion reservoir region 332 of the RRAM cell 302 overlying and abutting the data storage region 328. The ion reservoir region 332 stores oxygen ions to facilitate resistance changes within the data storage region 328. Resistance changes are typically performed through application of a voltage across the ion reservoir and data storage regions 328, 332 to move oxygen ions between the ion reservoir and data storage regions 328, 332. When a reset voltage is applied, oxygen ions move from the ion reservoir region 332 to the data storage region 328, thereby combining with the oxygen vacancies of the conductive filaments 330 and partially breaking the conductive filaments (such that the conductive filaments are partially formed). When a set voltage is applied, oxygen ions move from the data storage region 328 to the ion reservoir region 332, thereby forming oxygen vacancies that form the conductive filaments 330.

A top electrode 334 of the RRAM cell 302 is arranged over the capping layer 326, and a hard mask 336 of the RRAM cell 302 is arranged over the capping layer 326. The hard mask 336 is residual material from the manufacture of the RRAM cell 302. The top electrode 334 may be, for example, a conductive material, such as doped polysilicon, titanium nitride, tantalum nitride, platinum, iridium, or tungsten. Further, the hard mask 336 may be, for example, a dielectric, such as silicon dioxide or silicon nitride.

A spacer layer 338 of the RRAM cell 302 extends from the ledge 314 of the bottom insulating layer 310, along sidewalls of the high κ layer 324, the capping layer 326, the top electrode 334, and the hard mask 336. The spacer layer 338 prevents leakage between the top and bottom electrodes 320, 334 and is used during the manufacture of the RRAM cell 302 to define a footprint of the RRAM cell 302. Further, a top insulating layer 340 lines the ledge 314 of the bottom insulating layer 310, the spacer layer 338, and the hard mask 336. The top insulating layer 340 may be, for example, silicon dioxide, silicon nitride, a multilayer oxide-nitride-oxide film, or USG.

A top interconnect structure 342 of the BEOL metallization stack is arranged over the bottom interconnect structure 304. The top interconnect structure 342 includes a passivation layer 344 surrounding the bottom insulating layer 310 and a top metallization layer overlying the passivation layer 344. Further, the top interconnect structure 342 includes a via 346 extending from a top metal feature 348, such as a bond pad, of the top metallization layer to the top electrode 334 through the passivation layer 344, the top insulating layer 340, and the hard mask 336. The passivation layer 344 may be, for example, an oxide or an extreme low-K dielectric, and the top metallization layer and the via 346 may be, for example, a metal, such as copper, aluminum, or tungsten.

Figure 4:
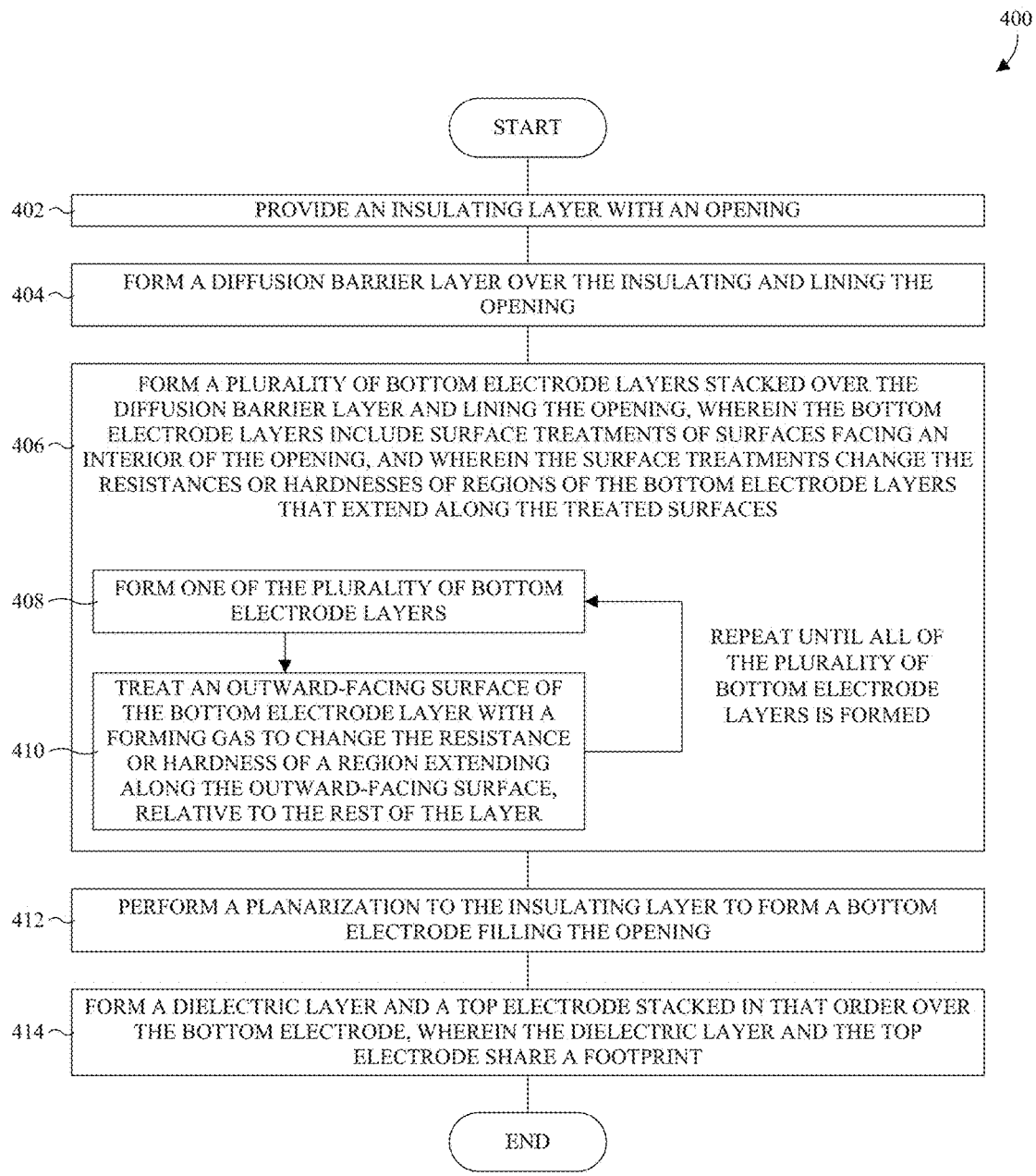
FIG. 4 illustrates a flowchart of some embodiments of a method for manufacturing an integrated circuit with a multilayer bottom electrode.

With reference to FIG. 4, a flowchart 400 provides some embodiments of a method for manufacturing a semiconductor structure with a multilayer bottom electrode.

At 402, an insulating layer is provided with an opening.

At 404, a diffusion barrier layer is formed over the insulating layer and lining the opening.

At 406, a plurality of bottom electrode layers is formed stacked upon the diffusion barrier layer and lining the opening. The bottom electrode layers include treatments of surfaces facing an interior of the opening. The surface treatments change the resistances or hardnesses of regions of the bottom electrode layers that extend along the treated surfaces. The process for forming the plurality of bottom electrode layers includes repeatedly: forming, at 408, a bottom electrode layer of the plurality; and treating, at 410, an outward-facing surface of the bottom electrode layer. The treating at 410 includes applying a forming gas to the outward-facing surface to change the resistance or hardness of an outward-facing region extending along the outward-facing surface, relative to the rest of the layer. The forming and the treating are repeated until all of the bottom electrode layers are formed, and typically a sufficient number of times to fill the opening.

At 412, a planarization is performed to the insulating layer to form a bottom electrode filling the opening.

At 414, a dielectric layer and a top dielectric layer are formed stacked in that order over the bottom electrode. The dielectric layer and the top electrode may be formed to share a footprint.

Advantageously, by forming the bottom electrode as described above, the uniformity of the electric field between the top and bottom electrodes is improved. In some embodiments, where the resistance of the bottom electrode top surface oscillates, the flow of charge is better distributed across the bottom electrode top surface since charge flows along the path of least resistance. This, in turn, leads to a more uniform electric field between the top and bottom electrodes. In some embodiments, where the hardness of the bottom electrode top surface oscillates, the height of the bottom electrode top surface oscillates since harder materials are more difficult to remove during the planarization. This, in turn, results in a more uniform electric field since the electric fields concentrate along surfaces with the highest radius of curvature (i.e., the pointiest regions of a surface).

Further, forming the dielectric layer and the top electrode with the same footprint advantageously protects the dielectric layer from the ambient environment. Where the dielectric layer corresponds to the high κ layer of a RRAM cell, oxygen from the air of the ambient environment would otherwise disrupt the operation of the RRAM cell since the RRAM cell operates using oxygen ions.

While the disclosed method (e.g., the method described by the flowchart 400) is illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

Figure 5:
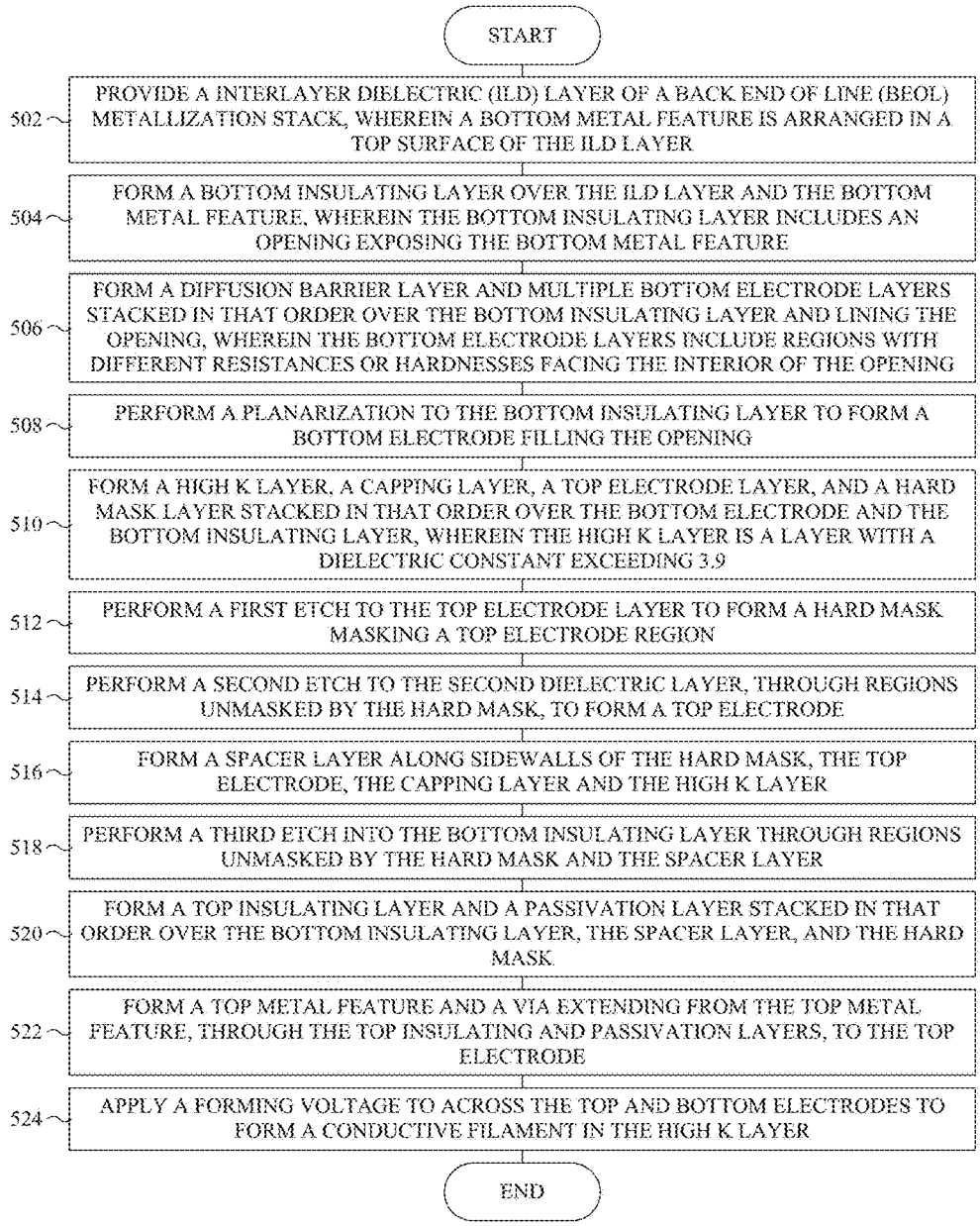
FIG. 5 illustrates a flowchart of some embodiments of a method for manufacturing an integrated circuit with a RRAM cell, the RRAM cell having a multilayer bottom electrode.

With reference to FIG. 5, a flowchart 500 provides some embodiments of a method for manufacturing an integrated circuit with a RRAM cell, the RRAM cell having a multilayer bottom electrode.

At 502, an ILD layer of a BEOL metallization stack is provided. A bottom metal feature is arranged in a top surface of the ILD layer.

At 504, a bottom insulating layer is formed over the ILD layer and the metal feature, wherein the bottom insulating layer includes an opening exposing the bottom metal feature.

At 506, a diffusion barrier layer and multiple bottom electrode layers are formed stacked in that order over the bottom insulating layer and lining the opening. The bottom electrode layers include regions with different resistances or hardnesses facing the interior of the opening, and extending respectively at angles relative to a top interface of the opening. In some embodiments, the bottom electrode layers are formed as described by Act 406 of FIG. 4.

At 508, a planarization is performed to the bottom insulating layer to form a bottom electrode filling the opening.

At 510, a high κ layer, a capping layer, a top electrode layer, and a hard mask layer are formed stacked in that order over the bottom electrode and the bottom insulating layer. The high κ layer is a layer with a dielectric constant exceeding 3.9.

At 512, a first etch is performed to the top electrode layer to form a hard mask masking a top electrode region.

At 514, a second etch is performed to the bottom insulating layer, through regions unmasked by the hard mask, to form a top electrode.

At 516, a spacer layer is formed along sidewalls of the hard mask, the top electrode, the capping layer and the high κ layer.

At 518, a third etch into the bottom insulating layer through regions unmasked by the hard mask and the spacer layer.

At 520, a top insulating layer and a passivation layer are formed stacked in that order over the bottom insulating layer, the spacer, and the hard mask.

At 522, a top metal feature and a via are formed, wherein the via is formed extending from the top metal feature, through the top insulating and passivation layers, to the top electrode.

At 524, a forming voltage is applied across the top and bottom electrodes to form a conductive filament in the high κ layer.

While the disclosed method (e.g., the method described by the flowchart 500) is illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

With reference to FIGS. 6-21, cross-sectional views of some embodiments of an integrated circuit with a RRAM cell at various stages of manufacture are provided to illustrate the method of FIG. 5. Although FIGS. 6-21 are described in relation to the method, it will be appreciated that the structures disclosed in FIGS. 6-21 are not limited to the method, but instead may stand alone as structures independent of the method. Similarly, although the method is described in relation to FIGS. 6-21, it will be appreciated that the method is not limited to the structures disclosed in FIGS. 6-21, but instead may stand alone independent of the structures disclosed in FIGS. 6-21.

Figure 6:
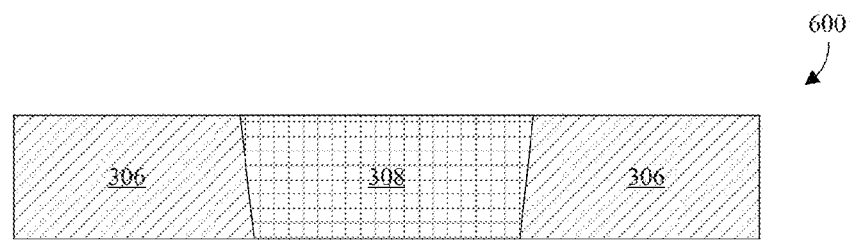
FIGS. 6-21 illustrate a series of cross-sectional views of some embodiments of an integrated circuit at various stages of manufacture, the integrated circuit having a RRAM cell with a multilayer bottom electrode.

FIG. 6 illustrates a cross-sectional view 600 of some embodiments corresponding to Act 502.

As illustrated by FIG. 6, an ILD layer 306 of a BEOL metallization stack is provided. The ILD layer 306 includes a bottom metal feature 308 extending into an ILD layer 306. The ILD layer 306 may be, for example, an oxide or an extreme low-κ dielectric. The bottom metal feature 308 may be, for example, a metal, such as copper or tungsten.

Figure 7:
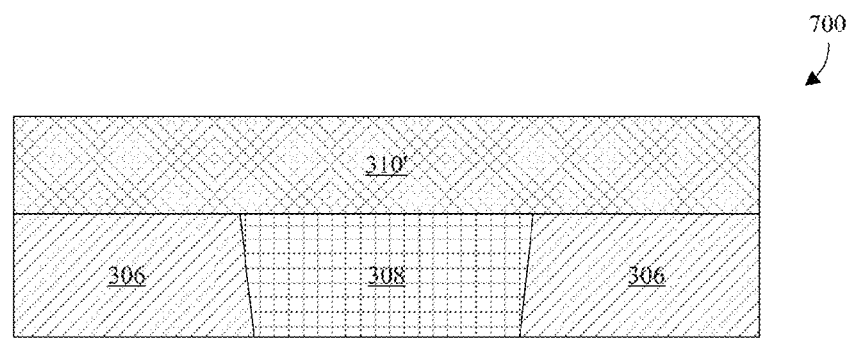
Figure 8:
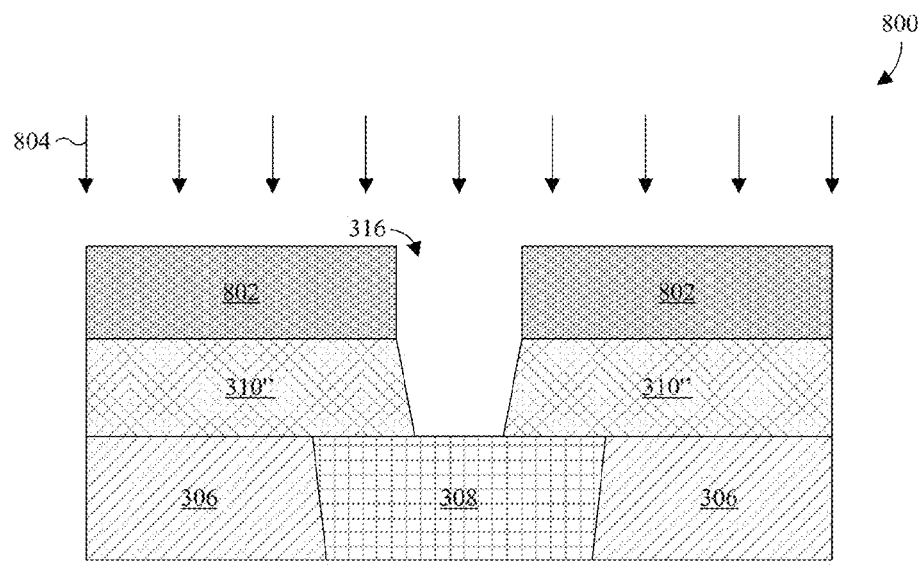

FIGS. 7 and 8 illustrate cross-sectional views 700, 800 of some embodiments corresponding to Act 504.

As illustrated by FIG. 7, a bottom insulating layer 310' is formed over the ILD layer 306 and the bottom metal feature 308. The bottom insulating layer 310' may be, for example, a single layer or a multilayer stack comprising one or more dielectric materials, such as SiC, SiN, $SiO_2$, NFARC), and USG. The process for forming the bottom insulating layer 310' may include, for example, sequentially forming the one or more layers stacked (e.g., vertically or laterally stacked) upon each other. The one or more layers may be formed using a deposition technique, such as, for example, chemical vapor deposition (CVD), physical vapor deposition (PVD), or atomic layer deposition (ALD).

As illustrated by FIG. 8, a first etch is performed, through a region of the bottom insulating layer 310' overlying the bottom metal feature 308, to the bottom metal feature 308. The first etch results in an opening 316 exposing the bottom metal feature 308. The process for performing the first etch may, for example, include: forming a photoresist layer 802 over the bottom insulating layer 310' and masking regions of the bottom insulating layer 310' surrounding a region corresponding to the opening 316; applying one or more etchants 804 selective of the bottom insulating layer 310', relative to the bottom metal feature 308, to the bottom insulating layer 310'; and removing the photoresist layer 802. Although the bottom surface and sidewalls of the opening 316 are illustrated as being flat or planar, it will be appreciated that the opening 316 can have a rounded bottom surface or sidewalls. Further, in some embodiments, the sidewalls can be vertical or substantially vertical. Thus, the opening 316 tends to be u- or v-shaped.

Figure 9:
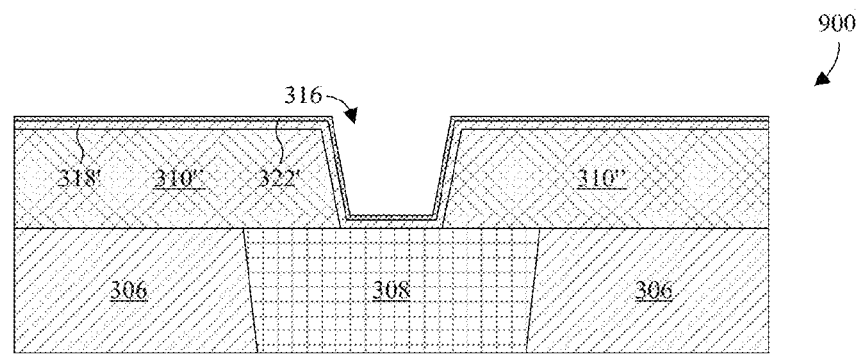
Figure 10:
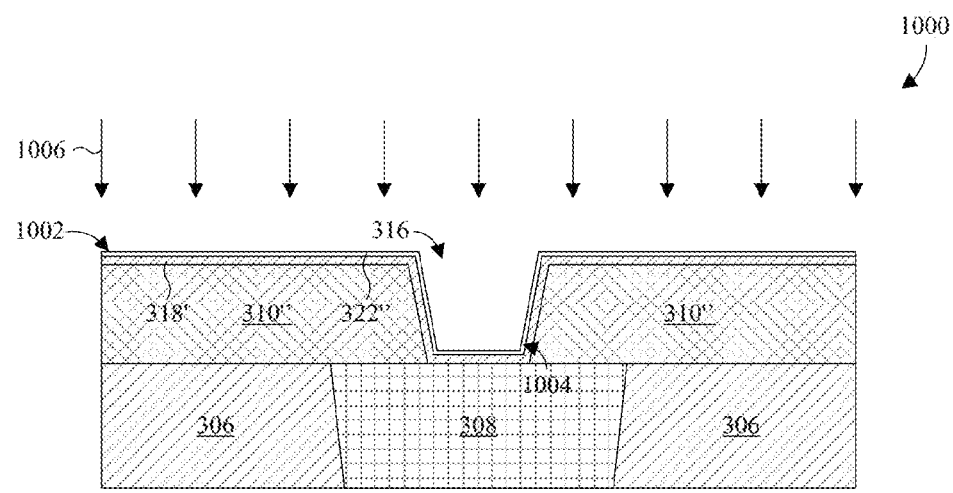
Figure 11:
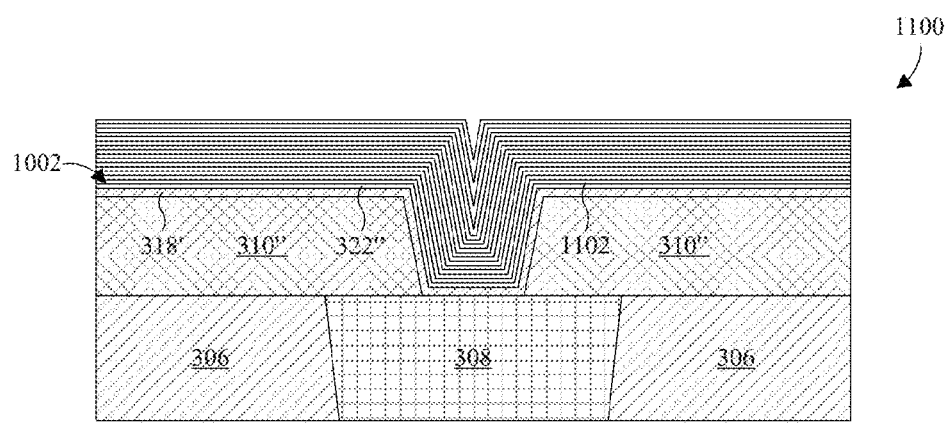

FIGS. 9-11 illustrate cross-sectional views 900, 1000, 1100 of some embodiments corresponding to Act 506.

As illustrated by FIG. 9, a diffusion barrier layer 318' and a bottom electrode layer 322' are formed stacked in that order over the remaining bottom insulating layer 310'', and lining the opening 316. The diffusion barrier layer 318' and the bottom electrode layer 322' may be, for example, a conductive material, such as TaN and TiN. Further, the bottom electrode layer may have, for example, a thickness of about 800 Angstroms. The diffusion barrier layer 318' and the bottom electrode layer 322' may be formed using any suitable deposition technique, such as, for example, CVD, PVD, or ALD. However, the diffusion barrier layer 318' and/or the bottom electrode layer 322' are typically formed conformally and/or following the surface contour of the opening 316. Therefore, the diffusion barrier layer 318' and/or the bottom electrode layer 322' typically have u- or v-shapes.

As illustrated by FIG. 10, an outward-facing surface 1002 of the bottom electrode layer 322' is treated. The treatment changes (e.g., increases) the resistance and/or hardness of an outward-facing region 1004 of the bottom electrode layer 322' that runs along the outward-facing surface 1002. The outward-facing region 1004 extends from the outward-facing surface 1002 into the bottom electrode layer 322' to a controlled depth. The depth to which the outward-facing region 1004 extends can be controlled by the length of time the outward-facing surface 1002 is treated. The surface treatment may be performed by applying a forming gas 1006 to the outward-facing surface 1002. The forming gas 1006 may include, for example, hydrogen and nitrogen, and/or may be formed, for example, from ammonia. In some embodiments, the surface treatment increases the concentration of nitrogen in the outward-facing region 1004, which changes the resistance and the hardness of the outward-facing region 1004.

By treating the outward-facing surface 1002, the bottom electrode layer 322' can be made up of a lower u- or v-shaped cross-sectional area, which is untreated, and an upper u- or v-shaped cross-sectional area, which is treated. The upper and lower u- or v-shaped cross-sectional areas have different resistances and different hardnesses. For example, the upper u- or v-shaped cross-sectional area of the bottom electrode layer 322' can have a higher or lower resistivity and/or hardness compared to the lower u- or v-shaped cross-sectional area of the bottom electrode layer 322'. In some embodiments, this transition from un-treated to treated can be gradual. For example, the concentration of nitrogen can gradually increase or decrease along a thickness of the bottom electrode layer 322'. In other embodiments, the transition from un-treated to treated can be sharp and distinct. The gradualness or sharpness can be "tuned" depending on the precise hardness and/or resistivity characteristics that are desired to properly shape the electric fields.

As illustrated by FIG. 11, additional bottom electrode layers 1102 are formed and treated as described above to fill the opening 316. The additional bottom electrode layers 1102 typically include between about 29 and about 49 additional bottom electrode layers 1102 are formed and treated as described above. Further, the additional bottom electrode layers 1102 are typically formed with a common thickness, such as a thickness of about 800 Angstroms, and/or sharing a thickness of the treated bottom electrode layer 322″.

Figure 12:
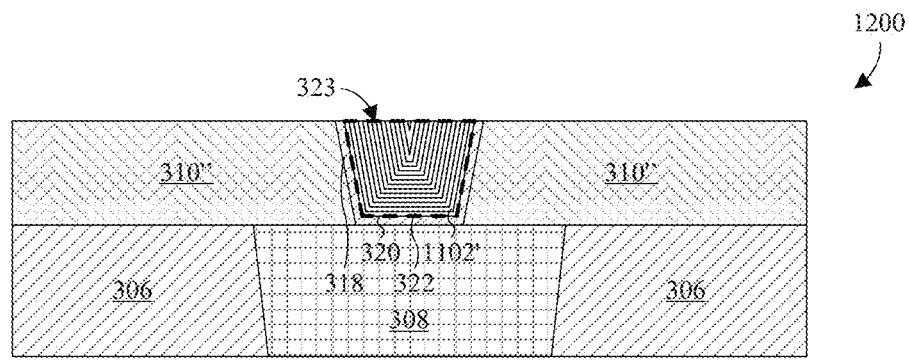

FIG. 12 illustrates a cross-sectional view 1200 of some embodiments corresponding to Act 508.

As illustrated by FIG. 12, a planarization is performed, into the treated bottom electrode layer 322″, the additional bottom electrode layers 1102, and the diffusion barrier layer 318′, to the remaining bottom insulating layer 310″. The planarization results in a bottom electrode 320, including the remaining treated bottom electrode layer 322 and the remaining additional bottom electrode layers 1102′, overlying the remaining diffusion barrier layer 318. The process for performing the planarization may include, for example, a chemical mechanical polish (CMP) and, in some embodiments, an etch back.

Where the resistances of the treated and additional bottom electrode layers 322″, 1102 vary with thickness, the resistance of the top surface 323 of the bottom electrode 320 oscillates along the bottom electrode top surface 323. Further, where the hardnesses of the treated and additional bottom electrode layers 322″, 1102 vary with thickness, the hardness of the top surface 323 of the bottom electrode 320 oscillates along the bottom electrode top surface 323. Because harder regions of the bottom electrode top surface 323 are more difficult to planarize, and hence removed at a slower rate, than softer regions, the planarization results in oscillations in height along the bottom electrode top surface 323. Further, because dishing may occur in softer portions of the top surface 323 of the bottom electrode 320, some portions of the planarized bottom electrode 320 may extend slightly below an upper surface of the remaining bottom insulating layer 310″. Nonetheless the upper surface of the bottom insulating layer 310″ and the top surface 323 of the bottom electrode 320 are generally aligned to one another.

Figure 13:
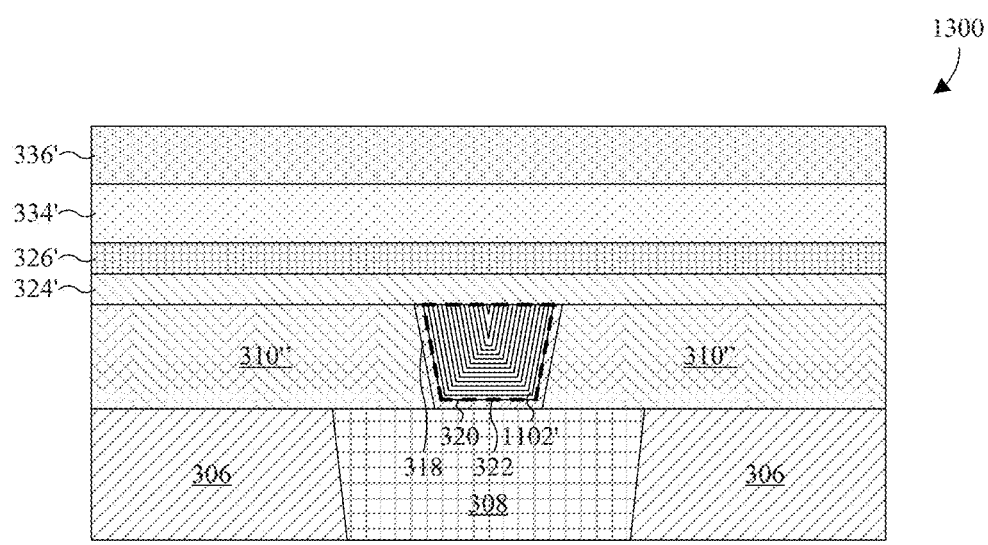

FIG. 13 illustrates a cross-sectional view 1300 of some embodiments corresponding to Act 510.

As illustrated by FIG. 13, a high κ layer 324′, a capping layer 326′, a top electrode layer 334′, and a hard mask layer 336′ are formed stacked in that order over the remaining bottom insulating layer 310″ and the bottom electrode 320. The high κ layer 324′ may be, for example, a single layer or a multilayer stack comprising hafnium oxide (HfO) and/or a group-V oxide. The capping layer 326′ may be, for example, a metal, a metal oxide, or some other material with a lower concentration of oxygen than the high κ layer. The top electrode layer 334′ may be, for example, a conductive material, such as doped polysilicon, titanium nitride, tantalum nitride, platinum, iridium, or tungsten. The hard mask layer 336′ may be, for example, a dielectric, such as silicon dioxide or silicon nitride. The process for forming the stack may include, for example, sequentially forming the high κ layer 324′, the capping layer 326′, the top electrode layer 334′, and the hard mask layer 336′ using suitable deposition techniques, such as CVD, PVD, or ALD.

Figure 14:
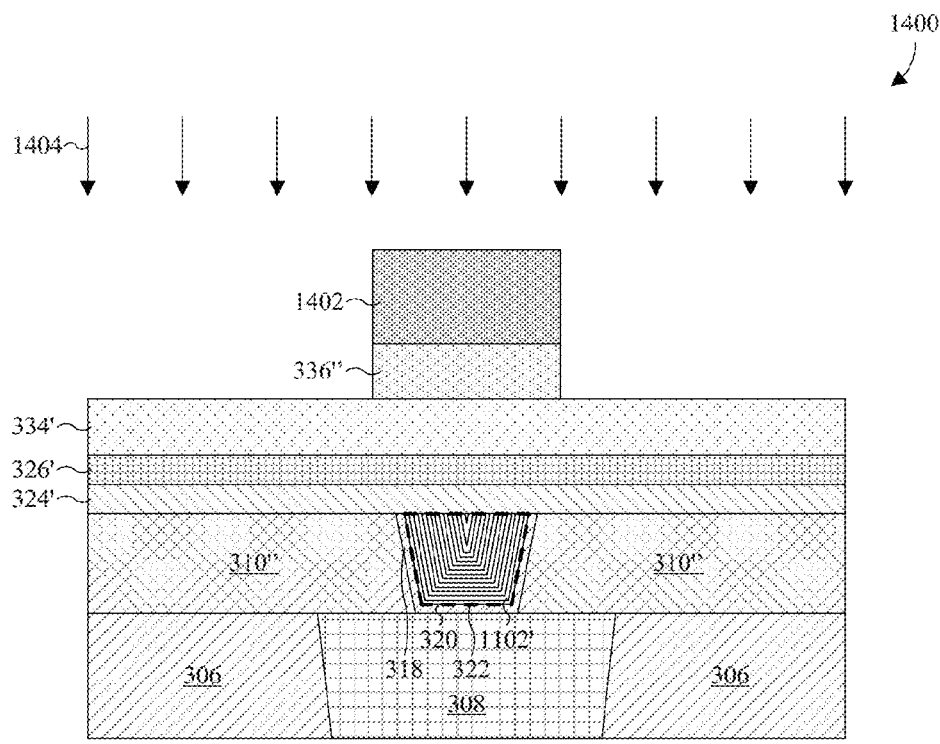

FIG. 14 illustrates a cross-sectional view 1400 of some embodiments corresponding to Act 512.

As illustrated by FIG. 14, a second etch is performed, through regions of the hard mask layer 336′ masking a top electrode region, to the top electrode layer 334′. The second etch results in a hard mask 336″ masking the top electrode region. The process for performing the second etch may, for example, include: forming a photoresist layer 1402 over the hard mask layer 336′ and masking the top electrode region; applying one or more etchants 1404 selective of the hard mask layer 336′, relative to the top electrode layer 334′, to the hard mask layer 336′; and removing the photoresist layer 1402.

Figure 15:
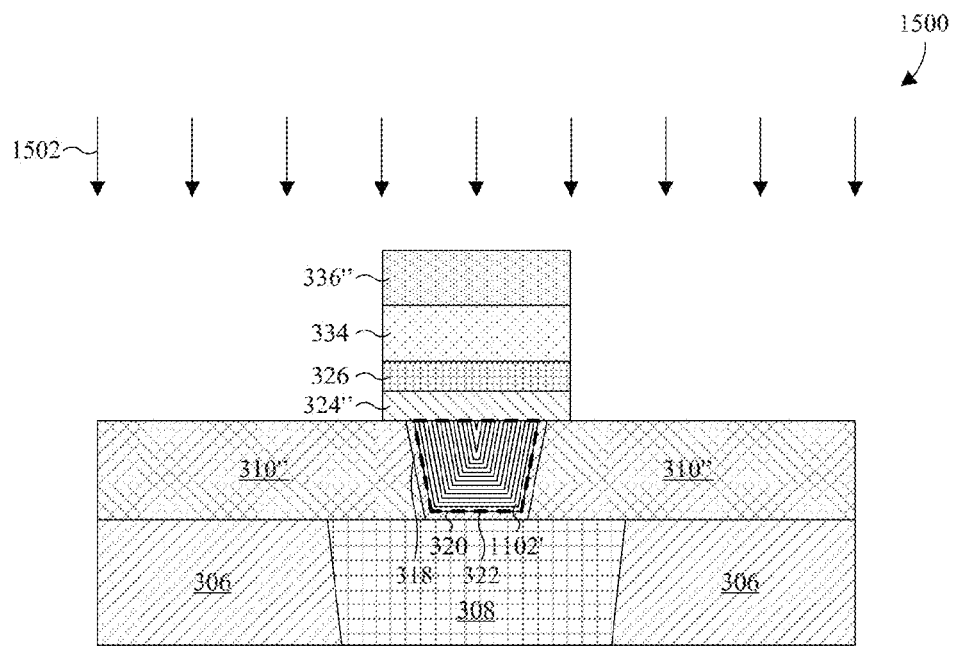

FIG. 15 illustrates a cross-sectional view 1500 of some embodiments corresponding to Act 514.

As illustrated by FIG. 15, a third etch is performed, through regions of the top electrode layer 334′, the capping layer 326′, and the high κ layer 324′ unmasked by the hard mask 336″, to the remaining bottom insulating layer 310″. The process for performing the third etch may include, for example, sequentially applying one or more etchants correspondingly selective of the top electrode layer 334′, the capping layer 326′, and the high κ layer 324′, relative to underlying layers, to the top electrode, capping, and high κ layers 324′, 326′, 334′.

Figure 16:
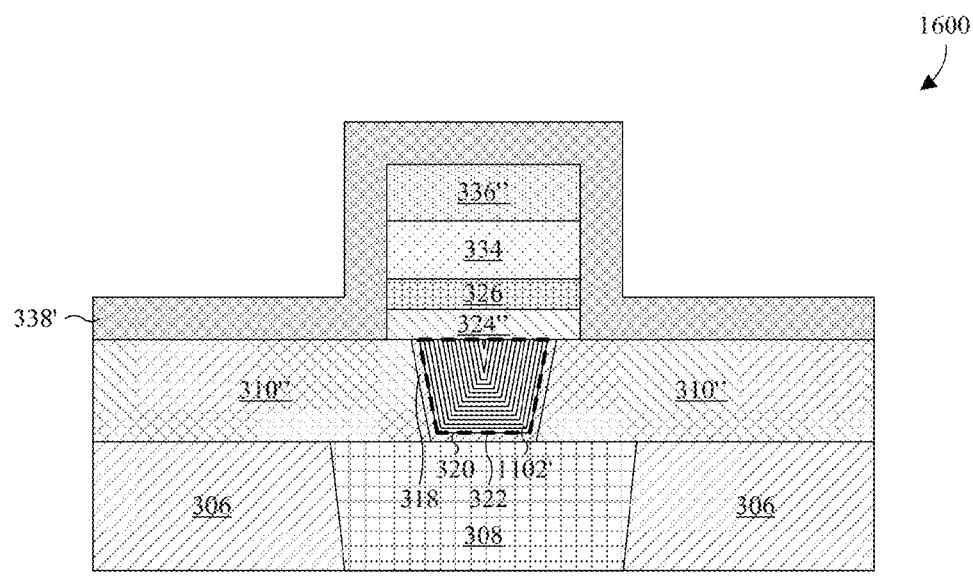
Figure 17:
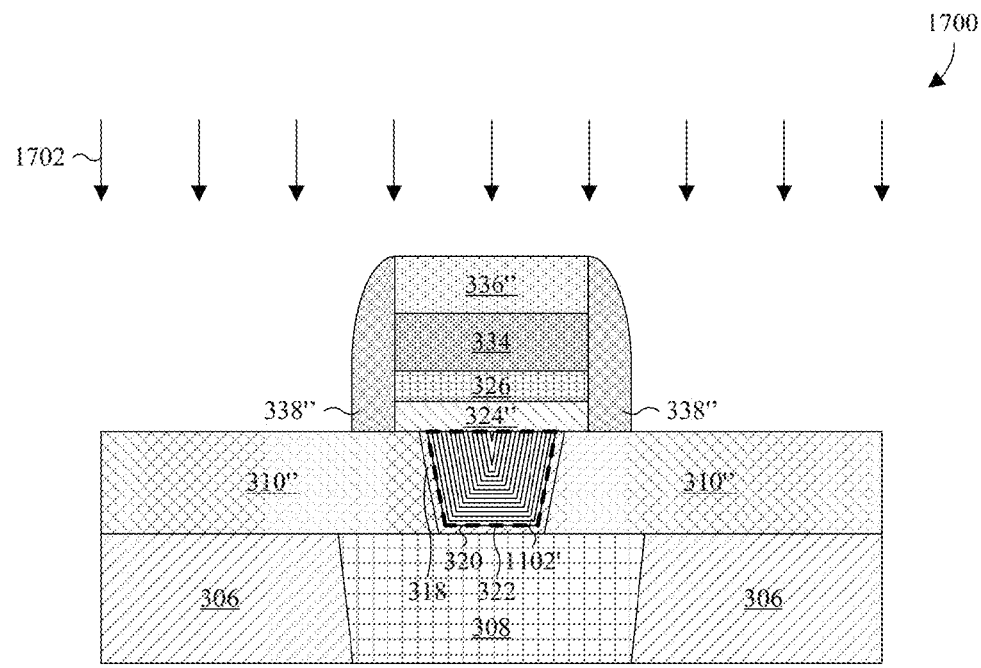

FIGS. 16 and 17 illustrate cross-sectional views 1600, 1700 of some embodiments corresponding to Act 516.

As illustrated by FIG. 16, a spacer layer 338′ is formed lining exposed surfaces of the remaining bottom insulating, high κ, and capping layers 310″, 324″, 326, the top electrode 334, and the hard mask 336″. The spacer layer 338′ may be, for example, a dielectric material, silicon nitride, a multilayer oxide-nitride-oxide film, or USG. The spacer layer 338′ is typically formed conformably, and may be formed using any suitable deposition technique, such as, for example, CVD, PVD, or ALD.

As illustrated by FIG. 17, a fourth etch is performed into the spacer layer 338′ to remove lateral stretches, and to etch the spacer layer 338′ back to below or about even with a top surface of the hard mask 336″. The process for performing the fourth may include, for example, applying one or more etchants 1702 selective of the spacer layer 338′, relative to the remaining bottom insulating layer 310″ and/or the hard mask 336″, to the spacer layer 338′.

Figure 18:
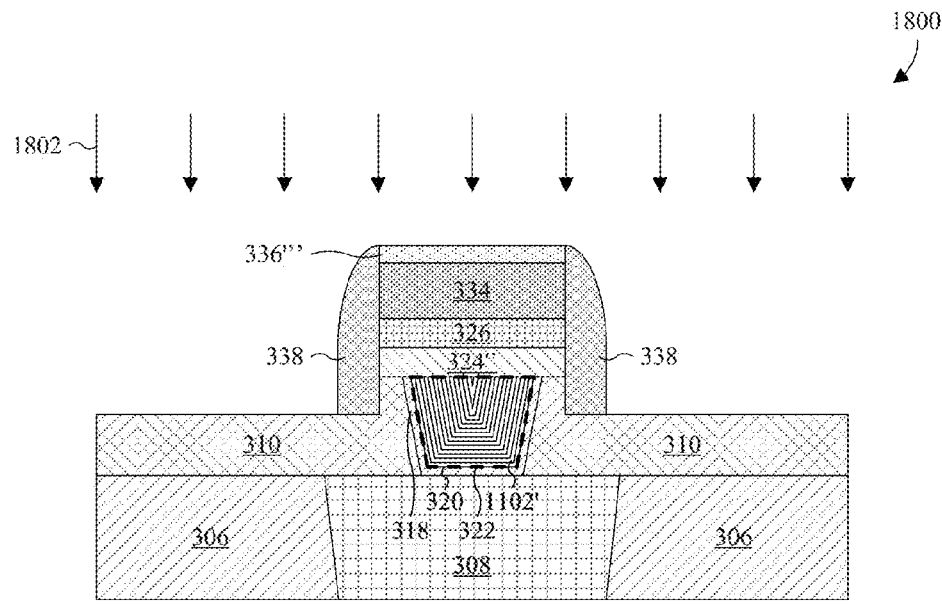

FIG. 18 illustrates a cross-sectional view 1800 of some embodiments corresponding to Act 518.

As illustrated by FIG. 18, a fifth etch is performed into regions of the remaining bottom insulating layer 310″ unmasked by the hard mask 336″ and the remaining spacer layer 338″. In some embodiments, the fifth etch partially erodes the hard mask 336″ and the remaining spacer layer 338″. The process for performing the fifth may include, for example, applying one or more etchants to the remaining bottom insulating layer 310″.

Figure 19:
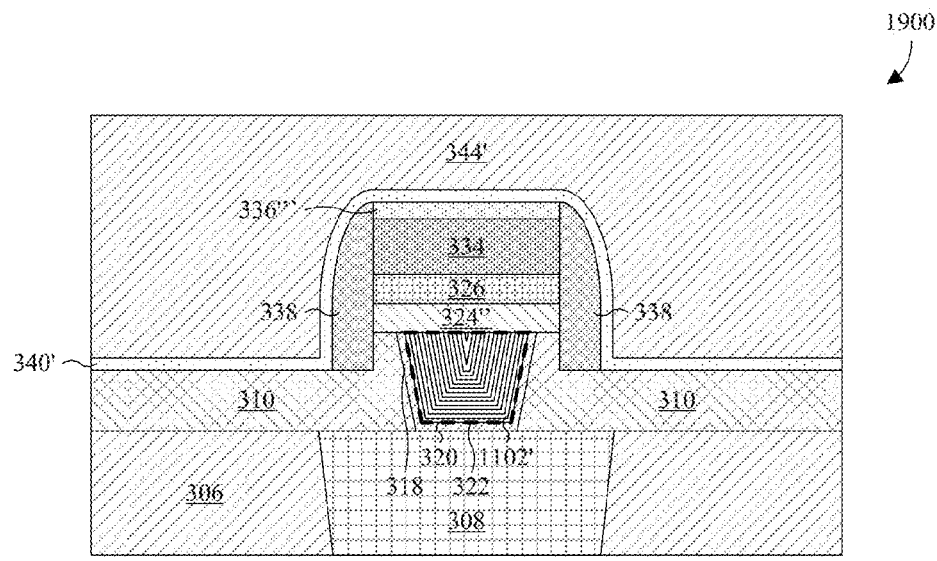

FIG. 19 illustrates a cross-sectional view 1900 of some embodiments corresponding to Act 520.

As illustrated by FIG. 19, a top insulating layer 340′ and a passivation layer 344′ are formed stacked in that order over the remaining bottom insulating and spacer layers 310, 338, and the remaining hard mask 336‴. The top insulating layer 340′ may be, for example, silicon nitride, a multilayer oxide-nitride-oxide film, or USG. The passivation layer 344′ may be, for example, an oxide or an extreme low-K dielectric. The process for forming the top insulating layer 340′ and the passivation layer 344′ may, for example, include: forming the top insulating layer 340′; forming an intermediate passivation layer; and performing a planarization into the intermediate passivation layer. The top insulating layer 340′ and the intermediate passivation layers may be formed using a suitable deposition technique, such as CVD, PVD, and ALD. Typically, the top insulating layer 340′ is conformally formed, whereas the intermediate passivation layer is non-conformally formed. The planarization may be performed using, for example, a CMP and/or an etch back.

Figure 20:
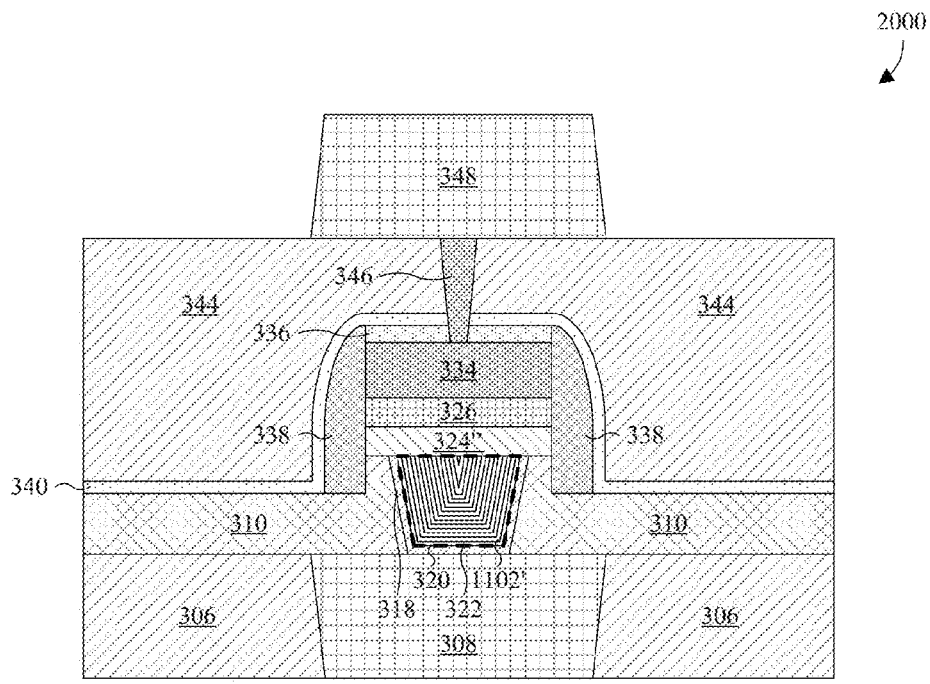

FIG. 20 illustrates a cross-sectional view 2000 of some embodiments corresponding to Act 522.

As illustrated by FIG. 20, a top metal feature 348, such as a bond pad, is formed over the passivation layer 344' with a via 346 extending therefrom to the top electrode 334. The via 346 extends through the passivation layer 344', the top insulating layer 340', and the remaining hard mask 336'''. The process for forming the top metal feature 348 and the via 346 may include, for example, performing one or more first etches to form an opening exposing the top electrode 334, forming a conductive layer over the remaining passivation layer 344 and filling the opening, and performing a second etch to define the top metal feature 348.

Figure 21:
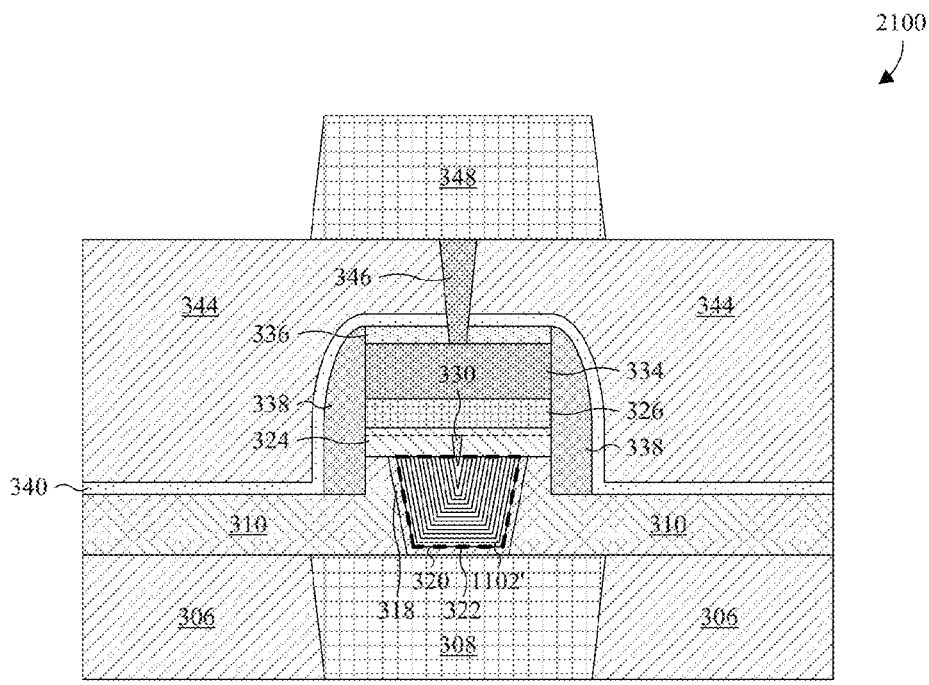

FIG. 21 illustrates a cross-sectional view 2100 of some embodiments corresponding to Act 524.

As illustrated by FIG. 21, a forming voltage is applied across the top electrode 334 and the bottom electrode 320 to form one or more conductive filaments 330 in the remaining high κ layer 324". The forming voltage is typically high so as to promote the migration of oxygen ions in remaining high κ layer 324" toward the top electrode 334. Based on the migration, oxygen vacancies align in the remaining high κ layer 324" to form the conductive filaments 330.

Thus, in some embodiments, the present disclosure provides a method for manufacturing an integrated circuit. An etch is performed into an insulating layer to form an opening. A plurality of bottom electrode layers is formed stacked upon each other and lining the opening. Forming the plurality of bottom electrode layers includes: repeatedly forming an intermediate layer over the insulating layer and lining the opening; and treating an outward-facing surface of the intermediate layer to change a property of an outward-facing region of the intermediate layer that extends along the outward-facing surface. A planarization is performed into the plurality of bottom electrode layers to the insulating layer. A dielectric layer and a top electrode are formed stacked in that order over the insulating layer and the remaining plurality of bottom electrode layers.

In other embodiments, the present disclosure provides another method for manufacturing an integrated circuit. An etch is performed into an upper surface of an insulating layer to form an opening. A plurality of electrode layers is formed filling the opening. Forming the plurality of electrode layers comprises repeatedly forming an electrode layer conformally lining an unfilled region of the opening until the opening is filled. Forming the electrode layer comprises depositing the electrode layer and treating a surface of the electrode layer that faces an interior of the opening. A planarization is performed into the plurality of electrode layers to the upper surface of the insulating layer.

In yet other embodiments, the present disclosure provides another method for manufacturing an integrated circuit. An etch is performed into a top surface of an insulating layer to form an opening. A diffusion barrier layer is formed conformally lining the opening. A plurality of bottom electrode layers is formed filling the opening over the diffusion barrier layer. Forming the plurality of bottom electrode layers comprises repeatedly forming a bottom electrode layer conformally lining an unfilled region of the opening until the opening is filled. Forming the bottom electrode layer comprises depositing the bottom electrode layer and treating a surface of the bottom electrode layer. Treating the surface of the bottom electrode layer divides the bottom electrode into a first region adjoining the surface and a second region spaced from the surface by the first region, where the first and second regions have different properties. A planarization is performed into the plurality of bottom electrode layers and the diffusion barrier layer to the top surface of the insulating layer. A dielectric layer is formed over the plurality of bottom electrode layers. A top electrode layer is formed over the dielectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing an integrated circuit, the method comprising:
   performing an etch into an insulating layer to form an opening;
   forming a plurality of bottom electrode layers stacked upon each other and lining the opening, wherein forming the plurality of bottom electrode layers includes repeatedly:
      forming an intermediate layer over the insulating layer and lining the opening; and
      treating an outward-facing surface of the intermediate layer to change a property of an outward-facing region of the intermediate layer that extends along the outward-facing surface;
   performing a planarization into the plurality of bottom electrode layers to the insulating layer; and
   forming a dielectric layer and a top electrode stacked in that order over the insulating layer and the remaining plurality of bottom electrode layers.

2. The method according to claim 1, further including:
   repeatedly forming the intermediate layer and treating the outward-facing surface of the intermediate layer until the opening is filled.

3. The method according to claim 1, further including:
   repeatedly forming the intermediate layer and treating the outward-facing surface of the intermediate layer between about 30 and about 50 times.

4. The method according to claim 1, further including:
   forming the intermediate layer of titanium nitride; and
   treating the outward-facing surface of the intermediate layer with a forming gas of nitrogen and hydrogen to increase a concentration of nitrogen in the outward-facing region of the intermediate layer.

5. The method according to claim 1, further including:
   treating the outward-facing surface of the intermediate layer to change a resistance or hardness of the outward facing region of the intermediate layer relative to a remaining region of the intermediate layer.

6. The method according to claim 1, further including:
   forming the bottom electrode layers with a common thickness.

7. The method according to claim 1, further including:
   performing the planarization to form a bottom electrode from the bottom electrode layers, wherein the bottom electrode is formed within the opening and is formed with a top surface approximately coplanar with a top surface of the insulating layer.

8. The method according to claim 7, wherein the bottom electrode is formed with a resistance or height oscillating along the top surface of the bottom electrode.

9. The method according to claim 1, wherein the bottom electrode layers are formed with u-shaped or v-shaped profiles within the opening.

10. A method for manufacturing an integrated circuit, the method comprising:
   performing an etch into an upper surface of an insulating layer to form an opening;
   forming a plurality of electrode layers filling the opening, wherein forming the plurality of electrode layers comprises repeatedly forming an electrode layer conformally lining an unfilled region of the opening until the opening is filled, and wherein forming the electrode layer comprises depositing the electrode layer and treating a surface of the electrode layer that faces an interior of the opening; and
   performing a planarization into the plurality of electrode layers to the upper surface of the insulating layer.

11. The method according to claim 10, wherein treating the surface of the electrode layer divides the electrode layer into a first region along the surface and a second region spaced from the surface by the first region, and wherein the first and second regions of the electrode layer have different resistances.

12. The method according to claim 11, wherein the first and second regions of the electrode layer have u-shaped or v-shaped profiles within the opening.

13. The method according to claim 10, wherein treating the surface of the electrode layer divides the electrode layer into a first region along the surface and a second region spaced from the surface by the first region, and wherein the first and second regions of the electrode layer have different hardnesses.

14. The method according to claim 13, wherein performing the planarization into the plurality of electrode layers recesses a top surface of the first region of the electrode layer and a top surface of the second region of the electrode layer to about even with the upper surface of the insulating layer.

15. The method according to claim 14, wherein the top surface of the first region of the electrode layer is elevated above the top surface of the second region of the electrode layer due to the different hardnesses.

16. The method according to claim 10, wherein the electrode layer is formed with a u-shaped or v-shaped profile within the opening.

17. The method according to claim 10, wherein treating the surface of the electrode layer comprises exposing the surface to a forming gas that changes a property of the electrode layer along the surface of the electrode.

18. The method according to claim 17, wherein the forming gas comprises hydrogen and nitrogen.

19. A method for manufacturing an integrated circuit, the method comprising:
   performing an etch into a top surface of an insulating layer to form an opening;
   forming a diffusion barrier layer conformally lining the opening;
   forming a plurality of bottom electrode layers filling the opening over the diffusion barrier layer, wherein forming the plurality of bottom electrode layers comprises repeatedly forming a bottom electrode layer conformally lining an unfilled region of the opening until the opening is filled, wherein forming the bottom electrode layer comprises depositing the bottom electrode layer and treating a surface of the bottom electrode layer, wherein treating the surface of the bottom electrode layer divides the bottom electrode layer into a first region adjoining the surface and a second region spaced from the surface by the first region, and wherein the first and second regions have different properties;
   performing a planarization into the plurality of bottom electrode layers and the diffusion barrier layer to the top surface of the insulating layer;
   forming a dielectric layer over the plurality of bottom electrode layers; and
   forming a top electrode layer over the dielectric layer.

20. The method according to claim 19, wherein treating the bottom electrode layer comprises exposing the surface of the bottom electrode layer to a forming gas, such that the first and second regions of the bottom electrode layer have different hardnesses or resistances.

* * * * *